United States Patent [19]

Strand

[11] 4,095,172
[45] June 13, 1978

[54] VEHICLE ANTENNA TESTER

[76] Inventor: William Strand, 747 Station Rd., Victoria, B. C., Canada, V9B 2S1

[21] Appl. No.: 767,202

[22] Filed: Feb. 9, 1977

[51] Int. Cl.$^2$ ............................................. G01R 31/02
[52] U.S. Cl. .................................... 324/51; 324/73 R
[58] Field of Search ............................ 324/51, 54, 73

[56] References Cited

U.S. PATENT DOCUMENTS

| | | | |
|---|---|---|---|
| 2,000,594 | 5/1935 | Hodgkinson | 324/51 |
| 2,550,787 | 5/1951 | Dedman | 324/73 X |
| 2,628,999 | 2/1953 | DeBruyne | 324/51 |
| 2,858,507 | 10/1958 | Liautaud et al. | 324/51 X |
| 2,960,654 | 11/1960 | Nelson | 324/51 X |
| 2,994,819 | 8/1961 | Vincent | 324/51 |
| 3,158,804 | 11/1964 | Weissert | 324/51 X |
| 3,643,157 | 2/1972 | Ettelman | 324/51 X |
| 3,648,163 | 3/1972 | Pinner et al. | 324/51 |
| 3,736,503 | 5/1973 | Coleman et al. | 324/51 |

*Primary Examiner*—Gerard R. Strecker
*Attorney, Agent, or Firm*—Robert D. Farkas

[57] ABSTRACT

A vehicle antenna tester utilizes a transformer having three secondary windings, two of which operate a pair of incandescent lamps, the third of which being capable of operating a neon lamp. The first of the pair of lamps is energized by completing a circuit involving a pair of clamps, one of which is attached to chassis ground of the vehicle, while the other is attached to the shielding conductor at selective locations therealong, of the lead cable feeding the antenna to be tested. The other lamp is energized when a circuit is completed between selective locations along the length of the antenna and the isolated conductor feeding it and the third clamp of the present invention. The neon lamp will glow upon the presence of leakage resistance or a short circuit between the antenna and its associated isolated conductor and the shielding conductor or chassis ground. The apparatus is particularly useful in testing antenna and lead wire assemblies before and after installation to the vehicle, determining faulty grounding of the shielding conductor, breaks in the continuity of the lead wire and antenna proper and leakage paths between the antenna and the isolated conductor to chassis ground or the shielding conductor.

2 Claims, 1 Drawing Figure

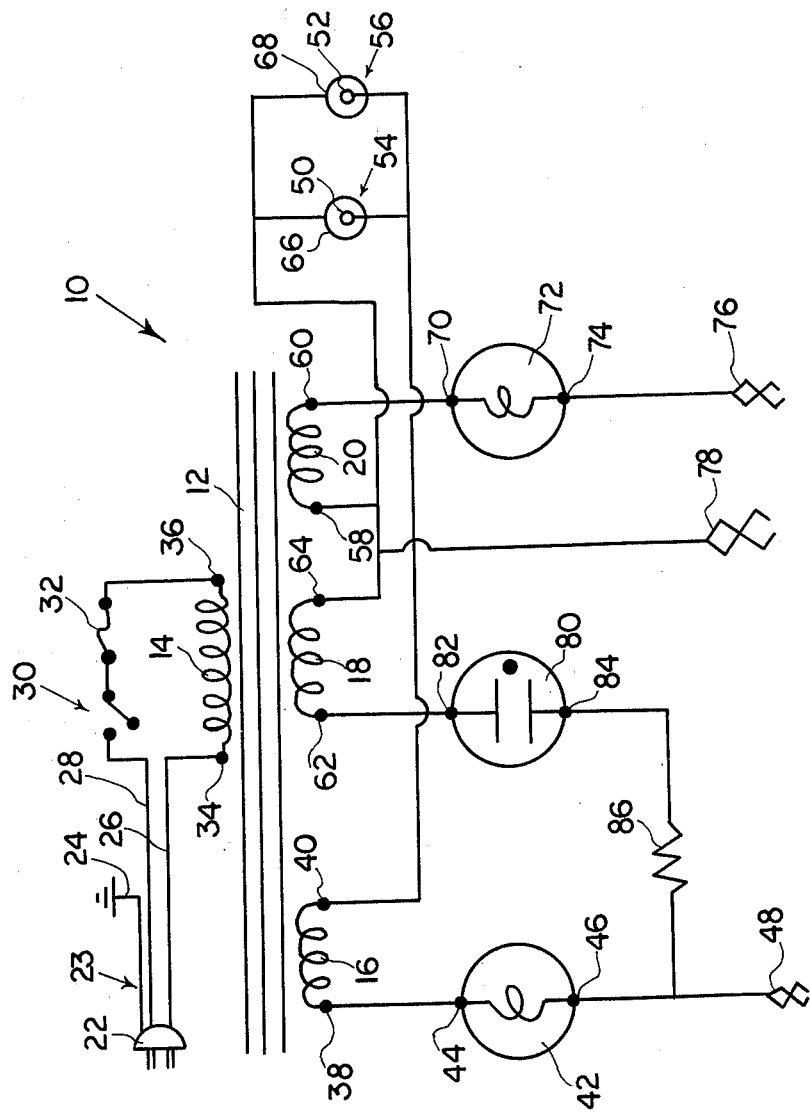

VEHICLE ANTENNA TESTER

BACKGROUND OF THE INVENTION

1. The Field of the Invention

This invention relates to continuity and insulation breakdown testing devices and more particularly to that class adapted to evaluate two terminal devices, one of which is grounded to a chassis of a vehicle.

2. Description of the Prior Art

The prior art abounds with continuity and voltage breakdown devices. My Canadian Pat. No. 992,611 dated July 6, 1976 discloses a car antenna tester utilizing a pair of clamps, one of which is adapted for connection to an antenna shield, the other of which is adapted for connection to an antenna. Three battery supplies are electrically interconnected to a triple pole single throw switch, each pole of which being individually connected to a pair of incandescent lamps and a neon lamp. An antenna jack is provided which is electrically connected to a plug fitted at one end of the lead wire coupled to the antenna. When the switch is closed, the continuity of the shield wire may be evaluated by judicious selective attachment of one of the clamps to the shielding conductor. In similar fashion, the other clamp determines the electrical continuity of the isolated conductor in the lead wire feeding the antenna. However, the device as disclosed, may constitute a shock hazard when the neon lamp interconnected with its individual high voltage battery supply to the pair of clamps, ionizes. Furthermore, the apparatus fails to provide a suitable arrangement for bench testing an antenna connected to a lead cable before installation in the vehicle, and fails to provide for the installed testing of an antenna and lead wire wherein the shielding conductor of the lead wire is not grounded as part of a normal installation.

U.S. Pat. No. 2,229,927 issued on Jan. 28, 1941 to J. A. Kamper teaches three indicating lamps, two of which are connected in a series electrical circuit terminating across a pair of electrical clamps. The third lamp bridges the electrical clamps. A probe wire is electrically connected at the junction of the pair of lamps in the series circuit. This device, devoid of internal source of energy is particularly useful in checking the electrical systems of motor vehicles and the like, utilizing the battery supply of the vehicle as a power source for illuminating the test lamps so as to dynamically present visual indications of the status of the electrical circuitry of the motor vehicle, in regard to the continuity and the shorting between the electrical elements thereof.

SUMMARY OF THE INVENTION

A primary object of the present invention is to provide an electrical testing apparatus which evaluates the continuity between selected points along the length of an antenna and its associated lead wire to the terminal end of the lead wire and the electrical breakdown resistance thereinbetween.

Another object of the present invention is to provide an antenna and lead wire tester suitable for bench testing use or for use on the apparatus to be tested when installed on a motor vehicle.

Still another object of the present invention is to provide an antenna and an antenna tester capable of viably testing antenna cable installations wherein the antenna cable is grounded solely at the end thereof connected to the electronic apparatus coupled to the antenna.

Yet another object of the present invention is to provide an antenna and an antenna tester capable of viably testing antenna cable installations wherein the points along the shielding conductor thereof to the chassis of a motor vehicle, thereby facilitating evaluation of the faulty or intermittent grounding of the shielding conductor.

A further object of the present invention is to provide an antenna and lead wire tester which indicates the presence of harmful leakage resistance or short circuits between the antenna and the shielding conductor circuits coupled thereto.

A still further object of the present invention is to provide an antenna and lead wire tester which may be operated from household utility current, thereby allowing for greater reliability in the leakage resistance testing of the lead cable.

Transceiver antennae and receiving antennae are most often vertically polarized whip devices when in use on motor vehicles. The electrical cable coupled to such antennae usually utilizes a co-axial cable whose central isolated conductor is electrically coupled to the whip antenna and whose shielding conductor may or may not be connected electrically to the chassis of the vehicle at one or more points other than the end of the cable electrically connected to the electronic device used on conjunction with the antenna. The present invention is capable of evaluating the continuity of the entire length or portions thereof, of the shielding conductor for both types of installations as well as when the antenna and lead wire is bench tested. Furthermore, the present invention is capable of checking the continuity along the circuit path comprising the entire length of the antenna and the isolated conductor feeding it, or selected portions thereof. The present invention is also capable of evaluating the presence of disastrous leakage resistance, or electrical shorts, between the antenna when coupled to the isolated conductor, and the shielding conductor, or the chassis of the vehicle.

These objects as well as other objects of the present invention, will become more readily apparent, after reading the following description of the accompanying drawing.

BRIEF DESCRIPTION OF THE DRAWING

The drawing is a schematic representation of the electrical components comprising the present invention.

DESCRIPTION OF THE PREFERRED EMBODIMENT

The structure and method of fabrication of the present invention is applicable to a vehicle antenna and lead wire tester having three output voltages available from a transformer energized by household utility current. This arrangement provides electrical output voltage at the terminals of the secondary windings of the transformer being substantially constant, dependent only upon the constancy of the input supply voltage to the primary of the transformer. The apparatus includes three electrical clamps, each connected to a flexible conductor having two of them electrically connected, each to a pair of individual incandescent lamps. Each of the individual lamps are electrically connected to separate low voltage secondary windings of the transformer. The third secondary winding produces a high voltage, preferably about 150 volts a/c, and is connected to a neon glow lamp or any glow emitting discharge device which may operate with low currents. The series circuit, comprising the high voltage secondary winding and the neon lamp, is connected across the circuits including the incandescent lamps, such that the neon lamp will glow, when a leakage path exists between the circuits coupled to the pair of clamps. A third clamp is provided which may be electrically connected to chassis ground, completing an electrical circuit including one of the low voltage secondary windings, one incandescent lamp, and one of the pair of clamps. A jack, of the variety similar to that utilized to electrically connect the transceiver or receiver end of the plug fitted at the end of the antenna cable, opposite the end to which the antenna is connected, or, a pair of terminals of any suitable variety, are connected to the aforementioned series circuit and to the other low voltage secondary winding. This arrangement facilitates the continuity testing of the shielding conductor by placement of the pair of clamps associated with this low voltage winding, at two separate points along the length of the shielding conductor, or if grounding of the shielding conductor testing is desired, by placing one clamp on chassis ground and the other clamp electrically contacting any desired point along the length of the shielding conductor.

The primary of the transformer is provided with a manually operated operating switch, such as a single pole single throw switch, which when closed enables the primary winding of the transformer to be energized. A fuse is also provided in series with the switch.

The neon lamp is provided with a series resistance to minimize the shock hazard which may occur when the neon lamp ionizes. The value of the resistance is not determinative of the breakdown voltage which the neon lamp must experience to ionize. The choice of the size of the resistance limits the conductor current passing through the ionized neon lamp and also limits the amount of voltage which may be experienced by the clamp to which it is electrically coupled.

More than one jack or electrical plug connector may be wired in parallel so as to facilitate the evaluation of more than one antenna at one time, or to permit antenna lead wires having different plugs affixed thereto, or none at all, to be tested with great facility.

Now referring to the Figure showing the present invention 10 comprising transformer 12 having a primary winding 14 and secondary windings 16, 18 and 20. Electrical plug 22, suitable for operation with household utility voltage is electrically connected at one end of cable 23, having a ground connection 24 suitable for attachment to the housing, not shown, enclosing the apparatus comprising the present invention, exclusive of the terminals and external cables and wires thereof. Conductors 26 and 28 provide electrical energy of the alternating current variety, to manually operated operating switch 30 in series circuit with fuse 32 and terminals 34 and 36, attached to ends of winding 14. Secondary winding 16 is provided with terminals 38 and 40. Terminal 38 is coupled to terminal 44 of incandescent lamp 42. Terminal 46 of incandescent lamp 42 is coupled to electrical clamp 48. Terminal 40 of winding 16, is electrically connected to contacts 50 and 52 of electrical receptacles 54 and 56 respectively.

Winding 20 terminates in terminals 58 and 60. Winding 18 terminates in terminals 62 and 64. Terminals 64 and 58 are interconnected and connected to contacts 66 and 68 of receptacles 54 and 56 respectively. It should be specifically understood that receptacles 54 and 56 are depicted schematically so as to represent in customary fashion, a receptacle adapted to receive co-axial plugs. Such receptacles may be of diverse shapes, sizes and functions, each including a pair of contacts for electrical connection to the conductors at one end of an antenna cable opposite the end to which the antenna is connected.

Terminal 60 of winding 20 is connected to terminal 70 of incandescent lamp 72. Terminal 74 is connected to electrical clamp 76. Clamp 78 is electrically connected to terminals 64 and 58.

Neon lamp 80 has terminal 82 thereof electrically connected to terminal 62 of winding 18. Terminal 84 of neon lamp 80 is electrically connected to one end of resistor 86. The other end of resistor 86 is electrically connected to clamp 48.

In bench testing use, the present invention is utilized in the following fashion:

Clamp 76 is connected to a selected location on the shielding conductor of the cable feeding the antenna. The cable is electrically connected with the shielding conductor applied to contacts 66 or 68 and the isolated antenna feeding wire connected to contacts 50 or 52. Upon the energization of transformer 12, lamp 72 will illuminate indicating a continuity between contacts 66 or 68 and the point of application of clamp 76. Alternatively, the continuity of the shielding conductor may be tested without connecting the shielding conductor to contacts 66 or 68 by applying clamps 78 and 76 to two points along the length of the conductor. Lamp 72 will illuminate only when continuity exists between the points to which clamps 76 and 78 have been applied. Continuity of the isolated antenna feeding conductor is determined by applying clamp 48 to a point along the length of the antenna or along the length of the isolated conductor connected to it. Neon lamp 80 will illuminate when either clamp 78, clamp 76 or contacts 66 or 68 are in electrical engagement with the shielding conductor, and clamp 48 is in electrical engagement with the antenna or the isolated conductor, and a sufficiently low leakage resistance or short circuit exists between the shielding conductor and the isolated conductor or the antenna.

It is to be noted that the bench use of the present invention is totally and wholly independent of the ground circuitry to be employed when the antenna cable and antenna is installed within a motor vehicle.

The present invention may be utilized in evaluating all of the facets of continuity and leakage resistance or shorts described above, when the present invention is utilized testing an antenna and associated cable when installed in a motor vehicle by using the procedures herein above described. A further use of the apparatus of the present invention, used in conjunction with an antenna installed in a motor vehicle, is in the detection and the location of faulty grounding, when such grounding is desired, or to detect the presence of such grounding when such grounding is not desired. This is accomplished by applying clamp 78 to the chassis ground of the vehicle and clamp 76 to the shielding conductor. Lamp 72 will illuminate only when the shielding conductor is in electrical engagement with chassis ground. During such testing, electrical connection to receptacles 54 or 56 should be disconnected, accompanied by shaking or vibrating the antenna cable and antenna, simulating the vibration experienced by the motor vehicle when in use.

One of the advantages of the present invention is an antenna and lead wire tester which may be operated from household utility current, thereby allowing for greater reliability in the leakage resistance testing of the lead cable.

Another advantage of the present invention is a electrical testing apparatus which evaluates the continuity between selected points along the length of an antenna and its associated lead wire to the terminal end of the lead wire and the electrical breakdown resistance there-in-between.

Still another advantage of the present invention is an antenna and lead wire tester suitable for bench testing use or for use on the apparatus to be tested when installed on a motor vehicle.

A further advantage of the present invention is an antenna and an antenna tester capable of viably testing antenna cable installations wherein the antenna cable is grounded solely at the end thereof connected to the electronic apparatus coupled to the antenna.

A still further advantage of the present invention is an antenna and an antenna tester capable of viably testing antenna cable installations wherein points along the shielding conductor thereof to the chassis of a motor vehicle facilitate evaluation of the faulty or intermittent grounding of the shielding conductor.

Yet another advantage of the present invention is an antenna and lead wire tester which indicates the presence of harmful leakage resistance or short circuits between the antenna and the shielding conductor circuits coupled thereto.

Thus there is disclosed in the above description and in the drawing, an embodiment of the invention which fully and effectively accomplishes the objects thereof. However, it will become apparent to those skilled in the art, how to make variations and modifications to the instant invention. Therefore, this invention is to be limited, not by the specific disclosure herein, but only by the appending claims.

I claim:

1. A vehicle antenna tester for checking the continuity of both the conductor and the shielding conductor of an antenna lead wire thereof and for checking the insulation between them and for checking the electrical grounding of them to said vehicle comprising;
   (a) three clamps, the first of said three clamps for coupling to said conductor, the second of said three clamps for coupling to said shielding conductor, the third of said three clamps for connection to the chassis of said vehicle,
   (b) a pair of lamps, one terminal of one of said lamps coupled to said first clamp, one terminal of the other of said lamps coupled to said second clamp,
   (c) a transformer, the primary winding of said transformer in a series electrical circuit with a manually operated operating switch and a fuse and a source of alternating current, the transformer having three secondary windings, each of said three windings terminating in a pair of terminals, one terminal of the first of said three secondary windings electrically coupled to the other terminal of said one of said lamps, one terminal of the second of said three secondary windings electrically coupled to the other terminal of said other of said lamps, one terminal of the third of said three secondary windings coupled electrically to the other terminal of said first winding,
   (d) said third clamp electrically coupled to said one terminal of said third winding,
   (e) a glow emitting discharge device, said discharge device having a pair of terminals, one of said discharge device terminals electrically coupled to the other terminal of said third winding, the other terminal of said discharge device electrically coupled to said second clamp, and
   (f) at least one electrical receptacle, the receptacle having a pair of contacts for electrical connection with said lead wire, one of said contacts electrically coupled to said one terminal of said third winding, the other of said contacts electrically coupled to the other terminal of said second winding.

2. The vehicle antenna tester as claimed in claim 1 further comprising a resistor, said resistor in a series electrical circuit with said glow emitting discharge device.

* * * * *